United States Patent [19]

Kemner et al.

[11] Patent Number: 4,707,662
[45] Date of Patent: Nov. 17, 1987

[54] MR-APPARATUS HAVING A TRANSMISSION-MEASURING COIL FOR HIGH FREQUENCIES

[75] Inventors: Rudolf Kemner; Hilco T. Kalmijn; Teunis R. Van Heelsbergen, all of Eindhoven, Netherlands

[73] Assignee: U.S. Philips Corporation, New York, N.Y.

[21] Appl. No.: 752,281

[22] Filed: Jul. 5, 1985

[30] Foreign Application Priority Data

Jul. 30, 1984 [NL] Netherlands .................. 8402380

[51] Int. Cl.⁴ ............................................. G01R 33/20
[52] U.S. Cl. ...................................... 324/318; 324/322
[58] Field of Search ............... 324/318, 307, 300, 322, 324/309; 128/653; 335/299; 333/33; 361/287, 277

[56] References Cited

U.S. PATENT DOCUMENTS

| 2,464,277 | 3/1949 | Webber | 333/33 |
| 3,034,039 | 5/1962 | Günthard et al. | 324/322 |
| 4,095,168 | 6/1978 | Hlauka | 324/322 |
| 4,439,733 | 3/1984 | Hinshaw et al. | 324/322 |
| 4,449,097 | 5/1984 | Young et al. | 324/318 |
| 4,594,566 | 6/1986 | Maudsley | 324/318 |
| 4,607,225 | 8/1986 | Crooks | 324/318 |
| 4,613,837 | 9/1986 | Blass et al. | 324/318 X |
| 4,621,237 | 11/1986 | Timms | 324/322 |

FOREIGN PATENT DOCUMENTS

| 0047065 | 3/1982 | European Pat. Off. | 324/318 |
| 0141383 | 5/1985 | European Pat. Off. | 324/318 |
| 0031070 | 2/1985 | Japan | 324/307 |
| 0067871 | 4/1985 | Japan | 324/307 |
| 8400214 | 1/1984 | World Int. Prop. O. | |

Primary Examiner—Michael J. Tokar
Assistant Examiner—Scott M. Oldham
Attorney, Agent, or Firm—Robert T. Mayer; Algy Tamoshunas

[57] ABSTRACT

For increasing the sensitivity of an MR apparatus when measuring comparatively high frequencies, the radio frequency excitation measurement coil (10, 30) is divided into two individual symmetrically drivable and readable coil halves (32, 34), respectively. The mutual connection of central connections of the coil halves can be realized by means of a balun (54) but for this purpose any other symmetrical form of coupling, for example using a strip-line transformer (70) or suitably dimensioned coaxial cables (60, 62) may alternatively be used.

7 Claims, 6 Drawing Figures

MR-APPARATUS HAVING A TRANSMISSION-MEASURING COIL FOR HIGH FREQUENCIES

BACKGROUND OF THE INVENTION

The invention relates to an MR apparatus having a magnet system for generating a uniform principal magnetic field and radio-frequency coil for generating MR signals in an object under examination.

Such an apparatus, designed in particular for performing a tomographic display, is known from Locher Philips Technical Review, Vol. 41, No. 3, 1983/1984, pp. 73-88. If in such an apparatus a strong uniform magnetic field is used, for example greater than 1 Tesla, which is desired in particular also for performing spectroscopic measurements in biological objects, problems are experienced in that the radio-frequency coil can also resonate at frequencies below the desired measurement frequencies. This is caused in particular by the invariably present stray capacities of the radio-frequency coil and the supply lines thereof. As a result of this, the coil ceases to be functional for higher frequencies.

SUMMARY OF THE INVENTION

It is an object of the invention to avoid the aforesaid restrictions and for that purpose an MR apparatus of the type mentioned in the opening paragraph is characterized according to the invention in that the radio-frequency coil is subdivided into a plurality of individual sections for the purposes of excitation and detection.

Since in an MR apparatus according to the invention the radio-frequency coil is excited or used to detect the MR signal while being subdivided into several individual sections, the voltage variation across the coil turns is reduced proportionally to the number of subdivisions. Consequently the effect of the stray capacities on the resonant frequency of the radio-frequency coil will be reduced.

In a preferred embodiment a radio-frequency coil is subdivided into several parts. The number of coil parts into which the coil is divided may be adapted to the circumstances and the type of coil. For a body coil, for example, a subdivision into four individual parts would be preferable and for a head coil a subdivision into two individual parts would normally be employed.

In a further embodiment, two central connections are interconnected by an electrical conductor which functions as a delay line, hereinafter termed a balun connection. Such a delay line consists, for example, of a coaxial cable whose length is chosen to be such that, for the frequency to be used, an electrical delay of $\frac{1}{2}\lambda$ will be provided.

In a further embodiment the connection between the central connections of the radio-frequency coil is realised by means of a high-frequency transformer, preferably in the form of a so-called strip-line transformer.

A few preferred embodiments according to the invention will now be described in greater detail hereinafter by way of example, with reference to the accompanying drawings, in which FIG. 1 shows an MR apparatus according to the invention, FIG. 2a shows diagrammatically one configurations for a radio-frequency coil, FIGS. 2b and 2c show schematically one-half of the radio-frequency coil of FIG. 2a, FIGS. 2d and 2g show schematically the development of a radio-frequency coil in accordance with the invention, FIG. 3 shows a radio-frequency coil having a $\frac{1}{2}\lambda$ central connection, FIG. 4 shows a coil according to FIG. 2 but of a different construction, FIG. 5 shows a radio-frequency coil having a high-frequency transformer as a central connection, and FIGS. 6a to 6c schematically illustrate the development of another embodiment of a radio-frequency coil in accordance with the invention.

DETAILED DESCRIPTION OF THE PREFERRED EMBODIMENTS

Figure 1:
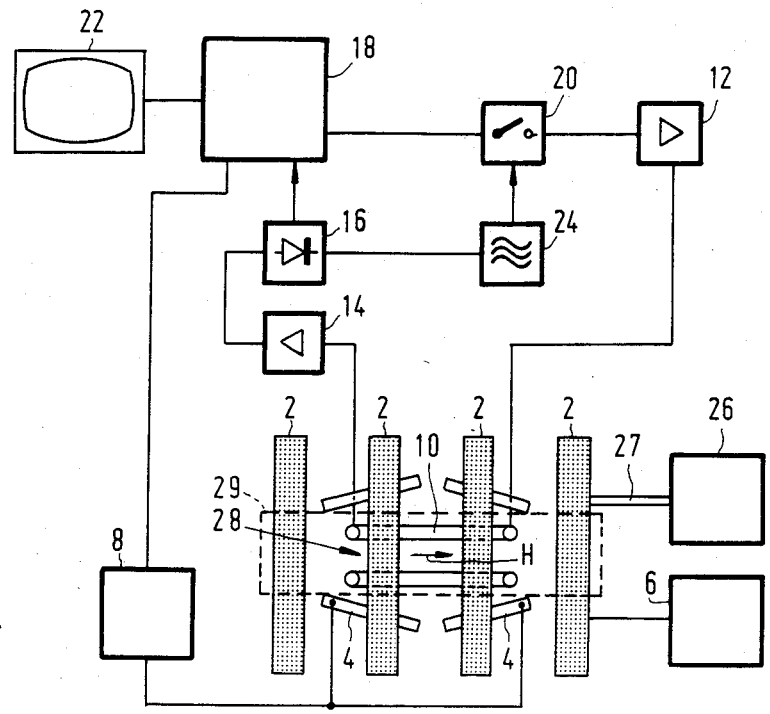
Figure 2:
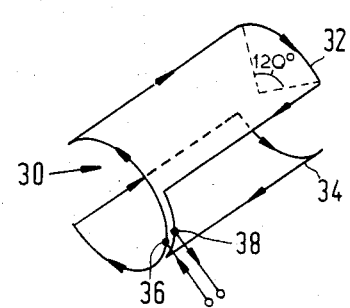
Figure 2:
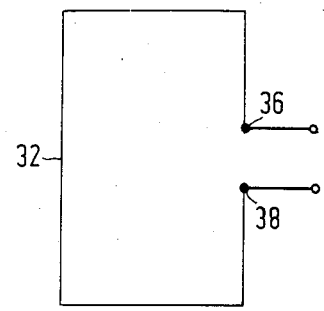
Figure 2:
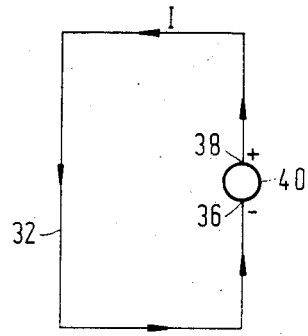
Figure 2:
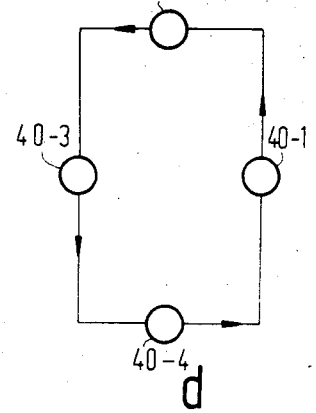
Figure 2:
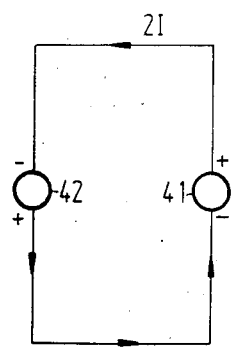
Figure 2:
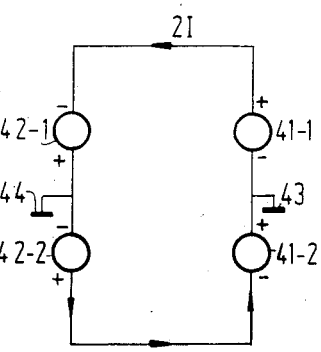
Figure 2:
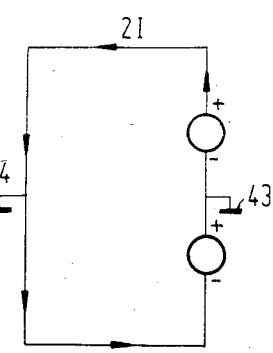

An MR apparatus as shown in FIG. 1 comprises a system of magnets 2 for generating a steady uniform magnetic field H, a system of magnets 4 for generating magnetic gradient fields, supply sources 6 and 8 for the system of magnets 2 and the system of magnets 4, respectively. A coil 10 serves to generate a radio-frequency alternating magnetic field and for that purpose is connected to a radio-frequency source 12. The radio-frequency coil 10 may also be used for the detection of MR signals generated in an object under examination by the radio-frequency transmission fields, for which purpose it is connected to a signal amplifier 14. The signal amplifier 14 is connected to a phase sensitive rectifier 16 which is connected to a central control device 18. The central control device 18, furthermore, controls a modulator 20 for the radio-frequency source 12, the supply source 8 for the gradient coils and a monitor 22 for picture display. A high-frequency oscillator 24 controls both the modulator 20 and the phase-sensitive rectifier 16 which processes the measurement signals. A cooling device 26 with cooling ducts 27 serves for optionally cooling the magnet coils 2 for the principal field. Such a cooling device may use water for cooling resistive coils or, as required to generate the high field strength desired here, for example, a liquid helium cooling system for superconducting magnet coils. The excitation coil 10 placed between the magnet coils 2 and 4 defines a measurement space 28 which in an apparatus for medical diagnostic measurements is amply sufficient to enclose the patient under examination. In the measurement space 28 thus a uniform magnetic field H, the gradient fields for selecting cross-sections of the object, and a spatially uniform radio-frequency alternating field can be generated. The radio frequency coil 10 in this case is assumed to combine the functions of an excitation coil and a detection, i.e. measurement coil. Alternatively, different coils may be used for these two functions, for example by using surface coils as measurement coils. According to the invention the radio-frequency coil 10 is driven while subdivided as an excitation coil and is read while subdivided as a detection measurement coil, which otherwise is not shown as such in FIG. 1. Hereinafter, the coil 10 will usually be referred to as the excitation coil. Concerning the use of the coil as a detection measurement coil, the same considerations apply in accordance with the reciprocity theorem. The method of driving the subdivided coil will be described in greater detail with reference to FIG. 2.

FIG. 2a shows a saddle coil 30 which is usual for an MR apparatus. A saddle coil combines a comparatively high sensitivity, a good degree of uniformity of field and a compact geometry and is frequently used as a radio-frequency excitation coil and as a detection coil. Such a coil 30 comprises two coil halves 32 and 34 which enclose an examination space in an apparatus. Each of the coil halves extends over an angle of preferably 120°. Connection terminals 36 and 38 serve, for example, not only as supply terminals for activating the coil, but also as measurement terminals for the output of MR signals generated in the coil. To avoid ambiguity in the description only one of the coil halves will be described hereinafter. Due to the symmetry of the coil, the following applies equally to the second coil half. In accordance with the reciprocity theorem applied here the following considerations also apply to the use of the coil as a detection measurement coil for the MR signals, i.e. the signals generated by the nuclear spins as they return again to the equilibrium situation in the principal magnetic field after excitation by the radio-frequency coil. In FIG. 2b the coil half 32 is shown diagrammatically as a rectangular conductor having connection terminals 36 and 38.

FIG. 2c shows a situation in which the coil 32 is activated by a voltage source 40, in practice a radio-frequency voltage source. An alternating radio-frequency current I now flows through the coil. The same alternating radio frequency current can also be generated in the coil half 32 by several radio frequency supply sources distributed throughout the circuit, for example four sources 40-1, 40-2, 40-3 and 40-4 as shown in FIG. 2d. The phase of each of the sources is adapted to the position thereof in the circuit. In this configuration, only the impedance between every successive pair of sources need be considered. The stray capacity and the inductance will be lower as a result of which the resonant frequency of the circuit will be higher. In a corresponding manner FIG. 2e shows a configuration having two signal sources 41 and 42. If the signal sources 41 and 42 are each of the same strength as the signal source 40 of FIG. 2c, a radio frequency current having a current strength equal to 2I will flow through each of the coil halves. By dividing each of the signal sources 41 and 42 into two equal sources 41-1 and 41-2, and 42-1 and 42-2, respectively, the configuration of FIG. 2g is formed with central connections 43 and 44. The energisation of the coil does not vary adjacent the central connections. Thus, while maintaining the central connections 43 and 44, the signal sources of each pair may now be combined, which results in the configuration of FIG. 2g. With this rearrangement also no change will occur in the energization of the coil. Comparing FIG. 2g with FIG. 2c, the same voltage will be present across half of the coil and, as already stated, a current 2I will flow through the circuit. With this configuration the effective impedance of the coil will be reduced by a factor 2 as a result of the symmetrical drive by the two sources and the central connections 43 and 44. Correspondingly, each of the coil halves may be subdivided into more than two circuit subdivisions. A reduction by a factor 2 of the impedance and hence a gain of a factor 2 for the resonant frequency of the coil, will already be sufficient for many applications.

Figure 3:
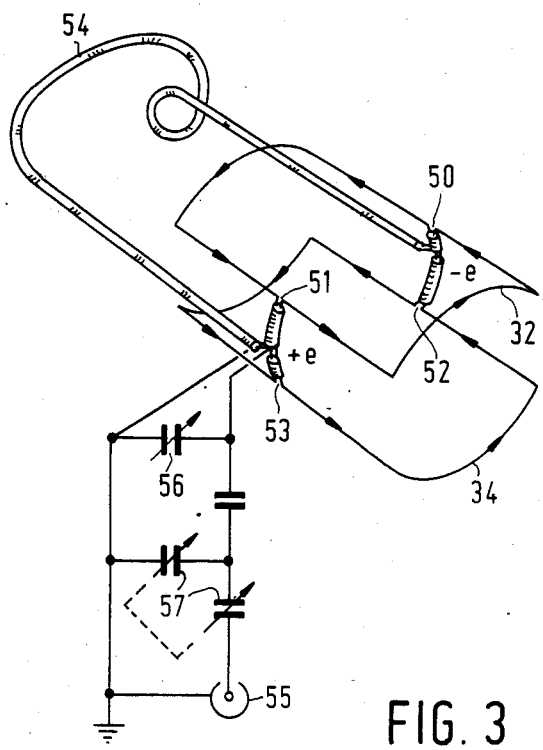

A practical construction of a coil with individually driven coil sections in agreement with the configuration in FIG. 2e is shown in FIG. 3. The two coil halves 32 and 34 in this case are connected to a signal source 55 via central connection points 50 and 51 for the coil half 32, central connection points 52 and 53 for the coil half 34 and a balun connection 54 connecting said central connections. A tuning circuit 56 and a matching circuit 57 are associated with the signal source. Hence for each of the coil halves the impedance is reduced to half the value and hence the resonant frequency of the coil has accordingly been increased.

Figure 4:
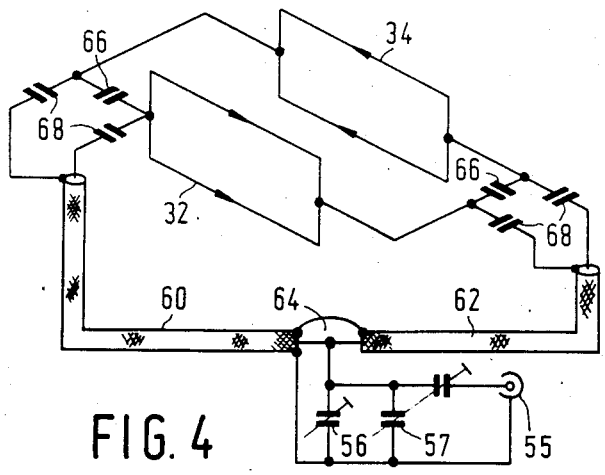

FIG. 4 shows another embodiment using the same principle. In this case the signal source 55 is connected centrally to, or in other words to the center conductor of, a coaxial connection cable 60, 62. Each of the coil halves 32 and 34 is thus connected, via coaxial cables 60 and 62, respectively, to the source 55 which in this case also comprises a tuning circuit 56 and a matching circuit 57. The screening of the coaxial conductor is not interrupted in the vicinity of a connection 64 but comprises there an insulated lead-through for making contact with the central conductor. Capacities 66 formed by the coaxial conductor and capacities 68 formed by the supply lines, in this case preferably form part of the tuning circuit. In practical cases these capacities have values of, for example, 15 pf for the capacities 66 and 5 pf for the capacities 68. The coaxial cables 60 and 62 are the same length but, apart from that, because the cables do not serve the function of a ½λ delay line, can be freely chosen in length and further construction. Their length and construction may accordingly be adapted to the geometry of the coil.

As already noted hereinbefore, the capacity of the coaxial cable may be used as a tuning and/or matching capacity in particular when coaxial cables are used as in the embodiment described with reference to FIG. 4. It may be practical, for example, to construct ends of the co-axial cable inthe form of a controllable capacitor. In a preferred embodiment this has been realised by giving the core wire of the cable the form of a comparatively rigid rod. A tube made of a suitable electrical insulator, for example of teflon, is slid around said rod which consists, for example, of copper, and around this again a copper envelope is slid for protection.

The copper envelope or outer conductor is constructed so that an axial displacement over the insulating tube can be effected. During this displacement the amount of the core rod which is surrounded by the outer tube is varied so that a form of capacitor tuning is realised. If desired, a tubular connection between the envelope and the core rod of the coaxial cable may be made. Such a variable capacitor may be provided in the most suitable place in the coaxial cable, for example, near the connection to the coil. The connections to the coil are preferably provided at or near the corners of the winding. As a result of this, any field disturbance in the most essential (i.e. central) part of the measurement field is prevented.

Figure 5:
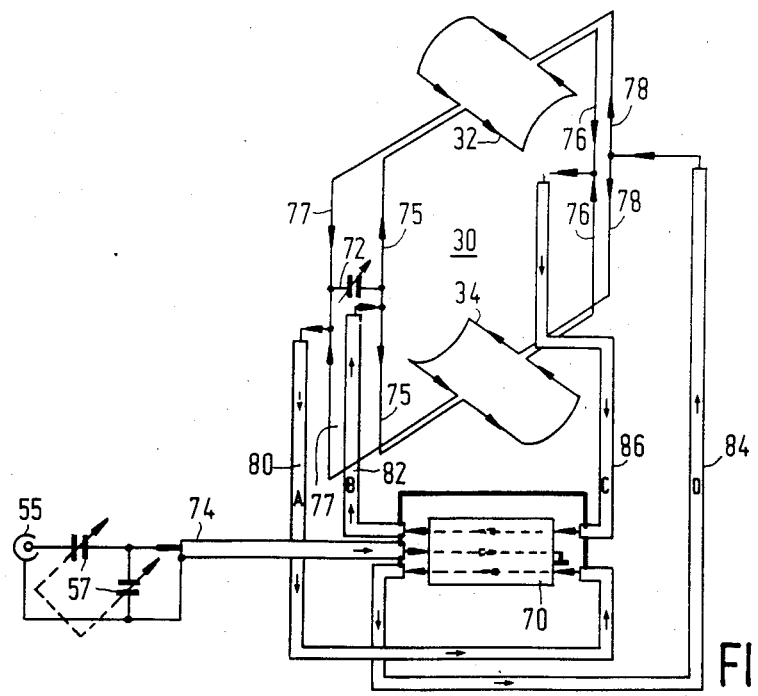

FIG. 5 shows diagrammatically an embodiment of an r.f. coil having a high frequency transformer 70, sometimes termed a strip-line transformer, as a connection between the two coil halves. The r.f. coil in this case also comprises a supply source 55 with a matching circuit 57 and a tuning circuit 72. A coaxial cable 74 connects the supply source 55 to the strip line transformer 70 while the coil halves 32 and 34 of the coil 30 are connected via supply conductors 75 and 76 and supply conductors 77 and 78, respectively, and via coaxial cables 80, 82, 84 and 86, mutually and to the strip-line transformer. By giving each of the coaxial cables 80 and 86 the same length, a symmetrical driving arrangement is realised for each of the coil halves in this case also. For tuning and matching the adjustable capacitors may be formed in this case also as a component of the coaxial cables.

Figure 6:
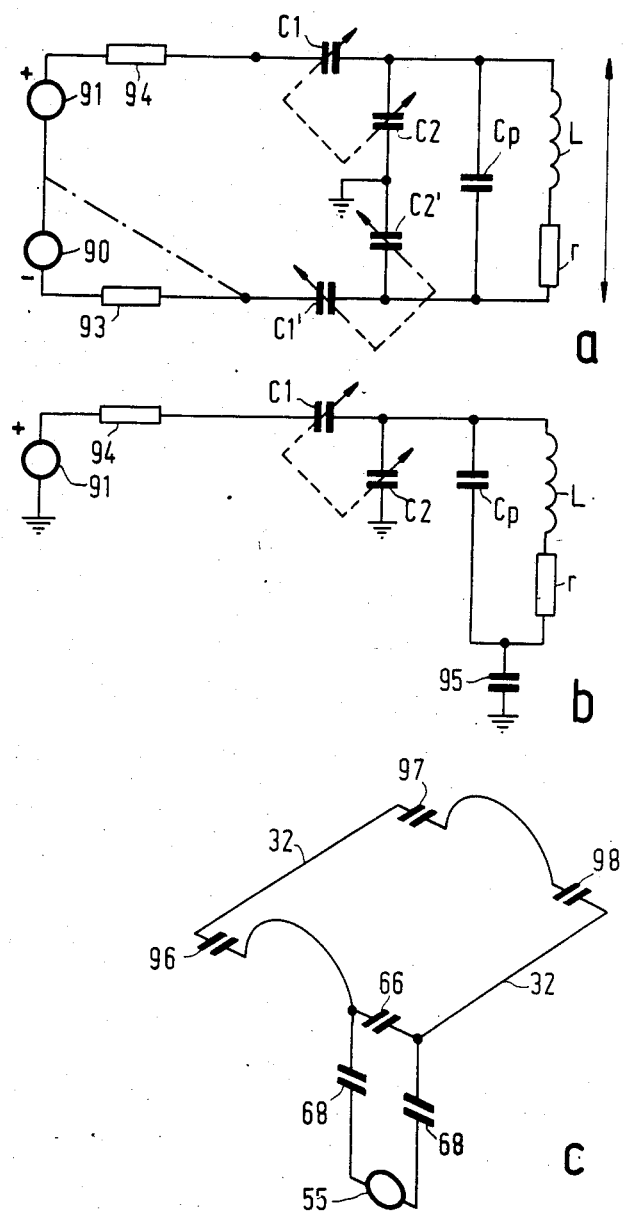

It can be demonstrated with reference to FIG. 6 that, in a symmetrical coil circuit as shown in FIG. 6a with a first source 90, a second source 91 which is connected in series with the first source, so as to provide a signal of opposite phase, source resistors 93 and 94, matching capacitors C1 and C2 and C'1 and C'2, a tuning and stray capacitor Cp, respectively, a coil L with resistance r, one of the sources 90 or 91 may be replaced by a psuedo source in the form of a capacitor 95. This substitution is permitted only if the coil circuit has a high Q-value and hence substantially the whole applied voltage appears across the coil L. As a result of this substitution the symmetrical coil circuit of FIG. 6a changes into the psuedo-symmetrical coil circuit of FIG. 6b. Correspondingly, in a coil having several supply sources or feed points distributed throughout the turns of the coil, for example as shown in FIG. 3, all the supply sources or feed points except one may be replaced by suitable capacitors. Said substitution results, for example, in a coil half circuit 32 as shown in FIG. 6c having a supply source 55, matching capacitors 68 and a tuning capacitor 66. In the coil line, in addition to the source 55, three capacitors 96, 97 and 98 are included to simulate the sources which they replace and which would otherwise be provided, or connections to the source 55. The capacitors 96, 97 and 98 and the primary source 55, are preferably connected at the corners of the coil half. Field disturbances, if any, by the capacitors can be reduced hereby. Each of the capacitors may again be constructed as a variable capacitor as described hereinbefore.

What is claimed is:

1. An MR apparatus having a magnet system for generating a uniform, principal magnetic field in a measurement space, means for generating, in said measurement space, a spatially uniform radio-frequency alternating field and means for detecing an MR signal generated in an object under examination disposed in said measurement space, said generating means including a pair of radio-frequency coils which are spaced from each other so as to accommodate said object to be examined therebetween, each coil of said pair being comprised of at least two sections connected so as to form a loop and each section having a connection point, and means for coupling said connection point of each of said sections to a radio-frequency supply source.

2. An MR apparatus as claimed in claim 1 wherein said connection points of said at least two coil sections of each coil are connected by a $\lambda/2$ delay line.

3. An MR apparatus as claimed in claim 1, wherein said coupling means includes a strip-line transformer, said coil sections being connected to said supply source through said strip-line transformer by coaxial cables of the same length.

4. An MR apparatus as claimed in claim 1, wherein said coupling means includes a tuning circuit and coaxial cables which connect respective ones of said coil sections to said supply source.

5. An apparatus as claimed in claim 4 wherein at least one of said coaxial cables forms part of said tuning circuit.

6. An apparatus as claimed in claim 5 wherein at least one end of said at least one coaxial cable has an inner conductor and an outer conductor portion which is axially movable relative to said inner conductor so as to form an adjustable capacitor.

7. An apparatus as claimed in claim 1, wherein said detecting means includes coils which serve to detect an MR signal after said radio frequency field is generated.

* * * * *